United States Patent
Wang et al.

(10) Patent No.: US 9,742,185 B2
(45) Date of Patent: Aug. 22, 2017

(54) DC CIRCUIT BREAKER AND METHOD OF USE

(71) Applicant: General Electric Company, Schenectady, NY (US)

(72) Inventors: Ruxi Wang, Niskayuna, NY (US); Satish Prabhakaran, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 104 days.

(21) Appl. No.: 14/698,576

(22) Filed: Apr. 28, 2015

(65) Prior Publication Data

US 2016/0322809 A1    Nov. 3, 2016

(51) Int. Cl.
| | |
|---|---|
| H02H 9/00 | (2006.01) |
| H02H 9/02 | (2006.01) |
| H02H 3/087 | (2006.01) |
| H02H 7/22 | (2006.01) |
| H03K 17/16 | (2006.01) |
| H03K 17/687 | (2006.01) |

(52) U.S. Cl.
CPC ............ *H02H 9/02* (2013.01); *H02H 3/087* (2013.01); *H02H 7/222* (2013.01); *H03K 17/165* (2013.01); *H03K 17/6874* (2013.01)

(58) Field of Classification Search
CPC ..................................................... H02H 9/02
USPC ......................................................... 361/57
See application file for complete search history.

(56) References Cited

U.S. PATENT DOCUMENTS

| | | | | |
|---|---|---|---|---|
| 4,618,906 A | * | 10/1986 | Paice ..................... | H02H 3/023 361/104 |
| 5,578,980 A | * | 11/1996 | Okubo ................... | H01H 9/542 335/132 |

(Continued)

FOREIGN PATENT DOCUMENTS

| | | |
|---|---|---|
| EP | 1480241 B1 | 4/2006 |
| KR | 20150040490 A | 4/2015 |

OTHER PUBLICATIONS

Sauragh Kulkarni and Surya Santoso; "Interrupting Short-Circuit Direct Current Using an AC Circuit Breaker in Series with a Reactor"; Research Article; Jul. 13, 2012; vol. 2012, Article ID 805598, 14 pages; Hindawi Publishing Corporation.

(Continued)

*Primary Examiner* — Stephen W Jackson
(74) *Attorney, Agent, or Firm* — Nitin N. Joshi

(57) ABSTRACT

A direct current circuit breaker includes main circuit for carrying a main-path current, and a transient circuit for carrying a transient-path current. The main circuit includes a first solid state switch and a main contactor. The first solid state switch is coupled in series with the main contactor. The transient circuit is coupled in parallel with the main circuit. The transient circuit includes an auxiliary contactor coupled in series with a second solid state switch. The second solid state switch closes when the main-path current exceeds a first threshold. The first solid state switch then opens. The main contactor opens when the main-path current falls below a second threshold. Then the second solid state switch opens. The auxiliary contactor opens when the transient-path current falls below the second threshold and after the second solid state switch opens.

26 Claims, 4 Drawing Sheets

(56) References Cited

U.S. PATENT DOCUMENTS

| | | | | |
|---|---|---|---|---|
| 6,046,899 | A * | 4/2000 | Dougherty | H01H 9/542 361/104 |
| 6,347,024 | B1 | 2/2002 | Blain et al. | |
| 7,057,311 | B1 | 6/2006 | Zhou et al. | |
| 7,079,363 | B2 * | 7/2006 | Chung | H01H 9/542 361/13 |
| 7,092,262 | B2 | 8/2006 | Ryan et al. | |
| 7,538,990 | B2 | 5/2009 | Belisle et al. | |
| 7,742,264 | B2 * | 6/2010 | Hyun | H02H 7/001 335/216 |
| 8,174,801 | B2 * | 5/2012 | Liu | H01H 9/542 361/13 |
| 8,350,414 | B2 | 1/2013 | West | |
| 8,638,531 | B2 | 1/2014 | Bhavaraju et al. | |
| 2004/0027734 | A1 | 2/2004 | Fairfax et al. | |
| 2005/0146814 | A1 | 7/2005 | Sellier et al. | |
| 2011/0102052 | A1 | 5/2011 | Billingsley et al. | |
| 2013/0329329 | A1 | 12/2013 | Liu et al. | |
| 2016/0285250 | A1 | 9/2016 | Lee et al. | |

OTHER PUBLICATIONS

Examination Report issued in connection with corresponding GB Application No. 1607365.2 on Oct. 28, 2016.
Canadian Office Action dated Mar. 7, 2017 issued in corresponding CA Application No. 2927496.

* cited by examiner

DC CIRCUIT BREAKER AND METHOD OF USE

BACKGROUND

The field of the disclosure relates generally to direct current (DC) circuit protection systems and, more particularly, to a DC circuit breaker and a method of use thereof.

Many known power circuits utilize circuit breakers to detect over-currents and break the circuit in response. Known circuit breakers utilize a mechanical contactor to make and break the circuit between a line side and a load side. When broken by a mechanical contactor, the circuit breaker provides galvanic isolation between the line side and the load side by a physical separation of the conductive path. The physical separation is between contacts of the mechanical contactor and occurs within a medium, such as air, for example, or another dielectric material. Known circuit breakers also utilize solid state switches, although solid state switches do not provide the galvanic isolation provided by mechanical contactors. Consequently, current can leak through an open solid state switch. For this reason, among others, solid state switches alone often do not satisfy some electrical safety standards.

When breaking a circuit under load, which is to break the circuit while carrying a non-zero current, an arc can occur across the contacts of the mechanical contactor. Arcs can also occur when making the circuit under load. Arc prevention and suppression are important aspects of circuit breaker design. The arc itself is a low-impedance conductive path formed through the medium by ionization due in part to the electric field. Arcs are high-energy and can be damaging to components, especially to breaker contact surfaces. Arcs can be dangerous for people near the arc, and also to those relying on the disconnection of the circuit, because the arc delays the break of the circuit. Arcs can also create electromagnetic interference issues that present further safety concerns.

A known approach to arc prevention is to remove the load and, thus, the current before breaking or making the circuit. Known circuit breakers are designed to actuate the mechanical contactor with sufficient speed and force to interrupt the arc. In alternating current (AC) circuits, the speed and force necessary to interrupt the arc is low because the current alternates direction and passes through zero each cycle. In contrast, DC circuit breakers must interrupt a non-zero current, which makes arcs significantly more likely and requires greater speed and force. The likelihood of arcs in DC circuit breakers drives their costs up and generally reduces their service life.

BRIEF DESCRIPTION

In one aspect, a direct current circuit breaker includes a main circuit and a transient circuit. The main circuit is configured to carry a main-path current and the transient circuit is configured to carry a transient-path current. The main circuit includes a first solid state switch and a main contactor. The first solid state switch is coupled in series with the main contactor. The transient circuit is coupled in parallel with the main circuit. The transient circuit includes an auxiliary contactor coupled in series with a second solid state switch. The second solid state switch is configured to close when the main-path current exceeds a first threshold. The first solid state switch is configured to open when the main-path current exceeds the first threshold and after the second solid state switch is closed. The main contactor is configured to open when the main-path current falls below a second threshold and after the first solid state switch opens. The second solid state switch is configured to open after the main contactor opens. The auxiliary contactor is configured to open when the transient path current falls below the second threshold and after the second solid state switch opens.

In another aspect, a method of operating a direct current circuit breaker includes closing, upon detection of a main-path current through a first solid state switch exceeding a first threshold, a second solid state switch in a transient. The method further includes opening a first solid state switch after closing the second solid state switch, thereby diverting the main-path current to the transient circuit. The method further includes opening a main contactor when the main-path current falls below a second threshold and when the first solid state switch is open. The method further includes opening the second solid state switch after opening the main contactor. The method further includes opening an auxiliary contactor, in the transient circuit, when a transient-path current falls below the second threshold and when the second solid state switch is open.

In yet another aspect, a direct current circuit breaker includes a line terminal, a load terminal, a contactor, a current sensor, and a driver. The contactor is coupled between the line terminal and the load terminal. The contactor includes a main circuit and a transient circuit coupled between the line terminal and the load terminal. The main circuit and transient circuit are further coupled in parallel. The main circuit includes a main contactor and a metal-oxide semiconductor field-effect transistor (MOSFET) switch. The current sensor is configured to measure a current through the contactor. The driver is coupled to the contactor and the current sensor. The driver is configured to close the transient circuit when the current exceeds a first threshold. The driver is further configured to open the MOSFET switch and, subsequently, the main contactor after the transient circuit is closed. The driver is further configured to open the transient circuit after the main contactor opens.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, a number of terms are referenced that have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure relate to direct current (DC) circuit protection systems. The DC circuit breakers described herein provide current interruption without arc and galvanic isolation between line and load. More specifically, the DC circuit breakers described herein include a main mechanical contactor in series with a solid state switch and a parallel high-impedance snubbing circuit. Upon detection of an over-current, the parallel high-impedance snubbing circuit diverts current from the main circuit through operation of solid state switches. The main mechanical contactor can then open under substantially lower current conditions and without arc. The DC circuit breakers described herein facilitate DC current interruption without arc, thus improving service life and cost of the DC circuit breakers. Moreover, the DC circuit breakers described herein provide galvanic isolation in compliance with electrical safety standards.

Figure 1:
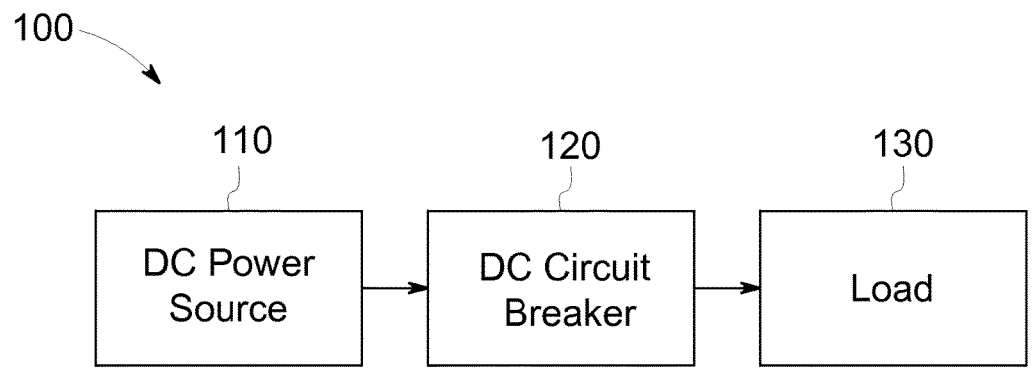
FIG. 1 is a block diagram of an exemplary direct current (DC) circuit.

FIG. 1 is a block diagram of an exemplary DC circuit 100. DC circuit 100 includes a DC power source 110, a DC circuit breaker 120, and a load 130. Load 130 is an electrical load that may include, for example and without limitation, DC electronic loads, motors, compressors, batteries, and DC-to-AC converters for alternating current (AC) appliances and other AC loads. DC power source 110 includes any suitable components for providing direct current at an appropriate voltage for load 130. In certain embodiments, DC power source 110 includes a battery. In alternative embodiments, DC power source 110 includes an AC generator and an AC-to-DC converter.

DC circuit breaker 120 is a DC circuit protection device for interrupting the direct current supplied by DC power source 110 to load 130 upon detection of an over-current. Over-currents occur as a result of a short circuit or fault, for example, and may also result from an over-sized load.

Figure 2:
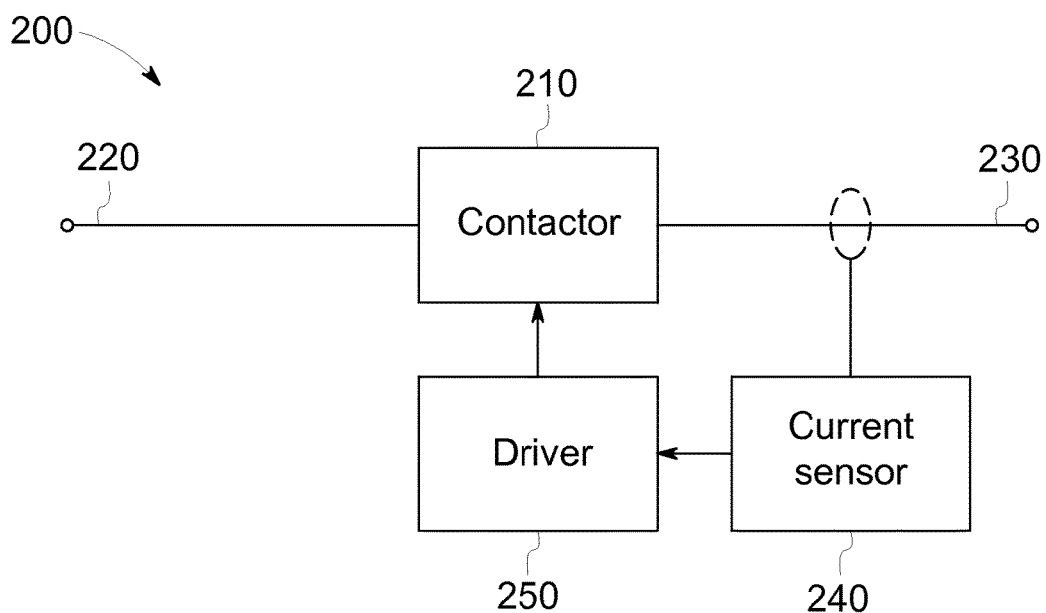
FIG. 2 is a block diagram of an exemplary DC circuit breaker for use in the DC circuit shown in FIG. 1.

FIG. 2 is a block diagram of an exemplary DC circuit breaker 200 for use in DC circuit 100 (shown in FIG. 1). DC circuit breaker 200 includes a contactor 210 that makes and breaks a connection between a line terminal 220 and a load terminal 230. DC circuit breaker 200 includes a current sensor 240 that detects current levels conducting through contactor 210. Current sensor 240 transmits a sensed-current signal to a driver 250. Driver 250 includes components that receive the sensed-current signal and generate one or more control signals for contactor 210. The control signals include, for example and without limitation, a signal to energize a coil of a relay and another signal to drive a gate of a transistor. In certain embodiments, driver 250 includes, for example and without limitation, a control circuit configured to trigger certain control signals at certain current levels.

Figure 3:
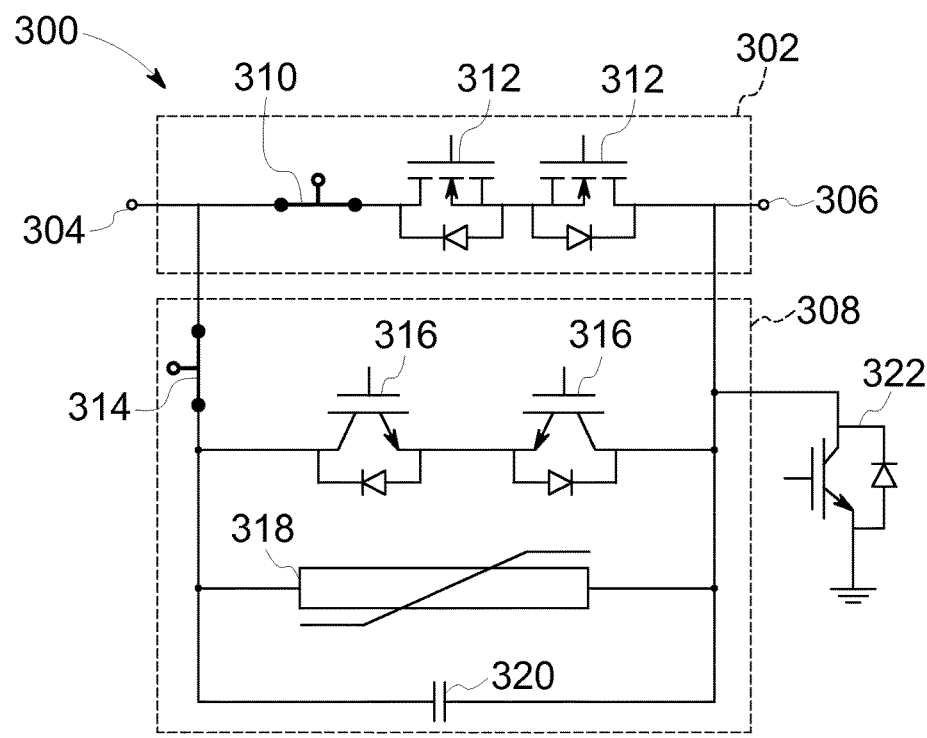
FIG. 3 is a schematic diagram of an exemplary DC circuit breaker for use in the DC circuit shown in FIG. 1.

FIG. 3 is a schematic diagram of an exemplary DC circuit breaker 300 for use in DC circuit 100 (shown in FIG. 1). DC circuit breaker 300 includes a main circuit 302 between a line terminal 304 and a load terminal 306, and a transient circuit 308, also between line terminal 304 and load terminal 306. DC circuit breaker 300 is configured to make and break a circuit between line terminal 304 and load terminal 306 and, more specifically, interrupt direct current flow between line terminal 304 and load terminal 306 without arc. In certain embodiments, DC circuit breaker 300 can break the circuit between line terminal 304 and load terminal 306 within 1 millisecond of an occurrence of a fault. DC circuit breaker 300 is further configured to provide galvanic isolation between line terminal 304 and load terminal 306 when in the open state.

Main circuit 302 includes a main contactor 310 coupled in series with solid state switches 312, all coupled between line terminal 304 and load terminal 306. Main contactor 310 is a mechanical contactor and provides the galvanic isolation when in the open state. Solid state switches 312 are semiconductor devices, such as, for example and without limitation, low-voltage metal-oxide semiconductor field-effect transistors (MOSFETs).

Transient circuit 308 is coupled in parallel with main circuit 302 between line terminal 304 and load terminal 306. Transient circuit 308 includes an auxiliary contactor 314 that couples and decouples transient circuit 308 to line terminal 304. Transient circuit 308 also includes serially-coupled solid state switches 316 coupled in parallel to a voltage clamping device 318. Voltage clamping device 318 is further coupled in parallel to a capacitor 320. Solid state switches 316 include, for example and without limitation, high-voltage insulated-gate bipolar transistors (IGBTs), power MOSFETs, and bipolar junction transistors (BJTs). Voltage clamping device 318 includes, for example, and without limitation, any suitable suppression device, including, for example, and without limitation, a metal-oxide varistor (MOV), a transient-voltage-suppression diode, and a gas-tube suppressor.

DC circuit breaker 300 also includes a high-voltage semiconductor switch 322 coupled between load terminal 306 and ground. High-voltage semiconductor switch 322 includes, for example and without limitation, high-voltage insulated-gate bipolar transistors (IGBTs), power MOSFETs, and bipolar junction transistors (BJTs). High-voltage semiconductor switch 322 is normally open and remains open during normal operation. Therefore, during normal operation, high-voltage semiconductor switch 322 receives the full line voltage applied to load terminal 306. During a fault condition and, more specifically, during a high impedance fault, high-voltage semiconductor switch 322 closes, diverting the current from main circuit 302 to ground. High-impedance faults occur, for example, and without limitation, when a human creates a path from line to ground. High-impedance refers to the impedance of a human relative to a low-impedance fault, such as, for example, and without limitation, an equipment fault. High-voltage semiconductor switch 322 thus facilitates a quick break sufficient for human fault protection.

Low-voltage solid state switches and high-voltage switches are rated as such relative to the overall voltage rating for DC circuit breaker 300. The rating thresholds for distinguishing between high-voltage and low-voltage vary per embodiment. For example, one embodiment of DC circuit breaker 300 is rated at 600 Volts, which is referred to as high-voltage for the one embodiment. Thus, a high-voltage solid state switch for the one embodiment is one rated at 600 Volts or greater. Given the 600 Volt high-voltage rating, a low-voltage solid state switch for the one embodiment is one rated at 100 Volts or fewer. In another embodiment, for example, DC circuit breaker 300 is rated at 100 Volts, which is referred to as high-voltage for that embodiment. Thus, a high-voltage solid state switch for that embodiment is one rated at 100 Volts or greater. Given the 100 Volt high-voltage rating, a low-voltage solid state switch for that embodiment is one rated at 20 Volts or fewer.

In DC circuit breaker 300, when in the closed state, main contactor 310, solid state switches 312, and auxiliary contactor 314 are closed, and solid state switches 316 are open. When in the closed state, main circuit 302 is a low-impedance path relative to transient circuit 308. When in the open state, main contactor 310 and auxiliary contactor 314 are open, providing galvanic isolation between line terminal 304 and load terminal 306.

In main circuit 302, main contactor 310 and solid state switches 312 are controlled by respective control signals from a driver, such as driver 250 (shown in FIG. 2). In transient circuit 308, auxiliary contactor 314 and solid state switches 316 are also controlled by respective control signals from the driver.

Assuming DC circuit breaker 300 is in the closed state and under load, when current flowing through main circuit 302 exceeds a first threshold, as sensed by a current sensor, such as, for example, current sensor 240 (shown in FIG. 2), solid state switches 316 are closed and solid state switches 312 are opened. The first threshold is, for example, the tripping current level for DC circuit breaker 300. The closing and opening of solid state switches 316 and 312 are achieved without arc, because transient circuit 308 provides a low-impedance path for the current. Main circuit 302 becomes high-impedance relative to transient circuit 308, so the current is diverted from main circuit 302 to transient circuit 308. Within transient circuit 308, the low-impedance path is through solid state switches 316 and auxiliary contactor 314, through which the current flows.

Having opened solid state switches 312 and diverted the current through transient circuit 308, the current through main contactor 310 is ideally zero. Solid state switches 312 may permit a small leakage current; however, current through main contactor is substantially zero. When the current through main contactor 310 falls below a second threshold, main contactor 310 is opened without arc. The second threshold is, for example, a current level at which arcing is unlikely during current interruption in the medium of main contactor 310.

Once main contactor 310 is open, solid state switches 316 are opened, again diverting the current, this time through voltage clamping device 318. Voltage clamping device 318 dampens the current and protects main circuit 302 from voltage spikes. When solid state switches 316 are opened and the current is diverted to voltage clamping device 318, capacitor 320 provides further protection to main circuit 302 against voltage spikes.

Once solid state switches 316 are open, the current through voltage clamping device 318 falls toward zero within a certain time. When the current through transient circuit 308 and auxiliary contactor 314 falls below the second threshold, auxiliary contactor 314 is opened without arc. When auxiliary contactor 314 and main contactor 310 are open, line terminal 304 is galvanically isolated from load terminal 306.

Figure 4:
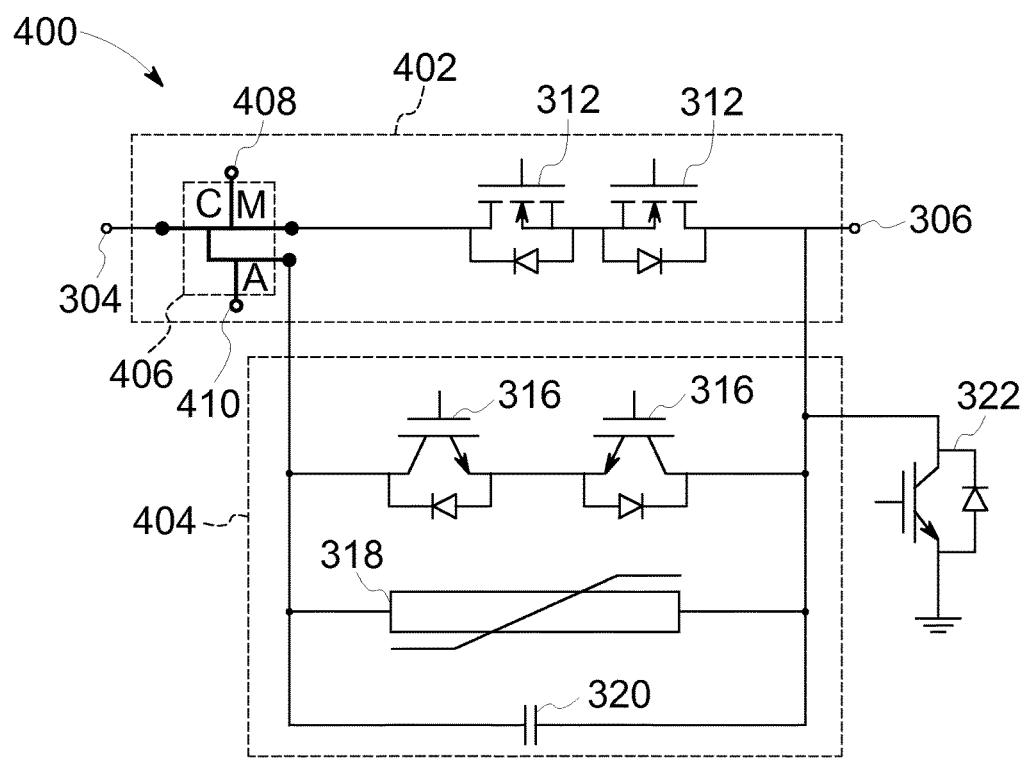
FIG. 4 is a schematic diagram of another exemplary DC circuit breaker for use in the DC circuit shown in FIG. 1.

FIG. 4 is a schematic diagram of another exemplary DC circuit breaker 400 for use in DC circuit 100 (shown in FIG. 1). DC circuit breaker 400 includes a main circuit 402 between line terminal 304 and load terminal 306, and a transient circuit 404, also between line terminal 304 and load terminal 306. DC circuit breaker 400 is configured to make and break a circuit between line terminal 304 and load terminal 306 and, more specifically, interrupt direct current flow between line terminal 304 and load terminal 306 without arc. DC circuit breaker 400 is further configured to provide galvanic isolation between line terminal 304 and load terminal 306 when in the open state.

Main circuit 402 includes an integrated three-pole contactor 406 coupled in series with solid state switches 312, all coupled between line terminal 304 and load terminal 306. Integrated three-pole contactor 406 includes a common contact C, a main contact M, and an auxiliary contact A. Integrated three-pole contactor 406 is a mechanical contactor and provides the galvanic isolation between common contact C and main contact M, and between common contact C and auxiliary contact A, when in the open state. Main circuit 402 includes the circuit between common contact C and main contact M. The circuit between common contact C and main contact M is opened and closed by a main control coil (not shown). When the main control coil is energized, the circuit between common contact C and main contact M is closed by a main contactor 408.

Transient circuit 404 is coupled in parallel with main circuit 402 between line terminal 304 and load terminal 306. Transient circuit 404 includes integrated three-pole contactor 406 and, more specifically, includes the circuit between common contact C and auxiliary contact A. The circuit between common contact C and auxiliary contact A is opened and closed by an auxiliary coil (not shown). When the auxiliary coil is energized, the circuit between common contact C and auxiliary contact A is closed by an auxiliary contactor 410. Transient circuit 404 also includes serially-coupled solid state switches 316 coupled in parallel to voltage clamping device 318, and further coupled in parallel to a capacitor 320.

DC circuit breaker 400 also includes high-voltage semiconductor switch 322 coupled between load terminal 306 and ground. High-voltage semiconductor switch 322 includes, for example and without limitation, high-voltage insulated-gate bipolar transistors (IGBTs), power MOSFETs, and bipolar junction transistors (BJTs). High-voltage semiconductor switch 322 is normally open and remains open during normal operation. Therefore, during normal operation, high-voltage semiconductor switch 322 receives the full line voltage applied to load terminal 306. During a fault condition and, more specifically, during a high impedance fault, high-voltage semiconductor switch 322 closes, diverting the current from main circuit 402 to ground. High-impedance faults occur, for example, and without limitation, when a human creates a path from line to ground. High-impedance refers to the impedance of a human relative to a low-impedance fault, such as, for example, and without limitation, an equipment fault. High-voltage semiconductor switch 322 thus facilitates a quick break sufficient for human fault protection.

In DC circuit breaker 400, when in the closed state, main contactor 408, auxiliary contactor 410, and solid state switches 312 are closed, and solid state switches 316 are open. When in the closed state, main circuit 402 is a low-impedance path relative to transient circuit 404. When in the open state, both the main control coil and the auxiliary control coil are de-energized, which opens main contactor 408 and auxiliary contactor 410. When open, integrated three-pole contactor 406 provides galvanic isolation between line terminal 304 and load terminal 306.

In main circuit 402, the main control coil and solid state switches 312 are controlled by respective control signals from a driver, such as driver 250 (shown in FIG. 2). In transient circuit 404, the auxiliary control coil and solid state switches 316 are also controlled by respective control signals from the driver.

Assuming DC circuit breaker 400 is in the closed state and under load, when current flowing through main circuit 402 exceeds a first threshold, as sensed by a current sensor, such as, for example, current sensor 240 (shown in FIG. 2), solid state switches 316 are closed and solid state switches 312 are opened. The first threshold is, for example, the tripping current level for DC circuit breaker 400. The closing and opening of solid state switches 316 and 312 are achieved without arc, because transient circuit 404 provides a low-impedance path for the current. Main circuit 402 becomes high-impedance relative to transient circuit 404, so the current is diverted from main circuit 402 to transient circuit 404. Within transient circuit 404, the low-impedance path is through solid state switches 316, common contact C, and auxiliary contact A, through which the current flows.

Having opened solid state switches 312 and diverted the current through transient circuit 404, the current through common contact C and main contact M is ideally zero. Solid state switches 312 may permit a small leakage current; however, current through common contact C and main contact M is substantially zero. When the current through main circuit 402 falls below a second threshold, the main control coil is de-energized and main contactor 408 is opened without arc. The second threshold is, for example, a current level at which arcing is unlikely during current interruption in the medium of integrated three-pole contactor 406.

Once main contactor 408 is open, solid state switches 316 are opened, again diverting the current, this time through voltage clamping device 318. Voltage clamping device 318 dampens the current and protects main circuit 402 from voltage spikes. When solid state switches 316 are opened and the current is diverted to voltage clamping device 318, capacitor 320 provides further protection to main circuit 402 against voltage spikes.

Once solid state switches 316 are open, the current through voltage clamping device 318 falls toward zero within a certain time. When the current through transient circuit 404, common contact C, and auxiliary contact A falls below the second threshold, the auxiliary control coil is de-energized and auxiliary contactor 410 is opened without arc. When auxiliary contactor 410 and main contactor 408 are open, line terminal 304 is galvanically isolated from load terminal 306.

Figure 5:
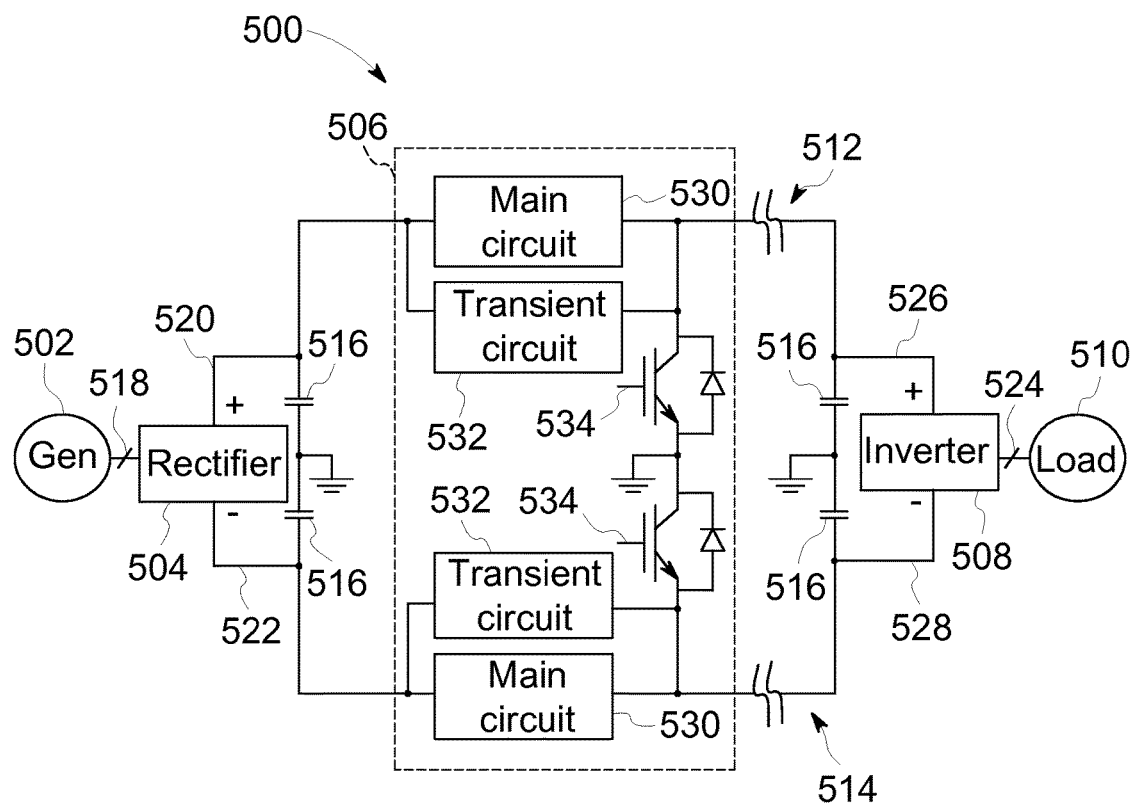
FIG. 5 is a schematic diagram of an exemplary DC circuit, such as the DC circuit shown in FIG. 1.

FIG. 5 is a schematic diagram of an exemplary DC circuit 500. DC circuit 500 includes a generator 502, a rectifier 504, a DC circuit breaker 506, an inverter 508, and a load 510. Inverter 508 and load 510 are coupled to DC circuit breaker 506 by a positive DC bus 512 and a negative DC bus 514. Inverter 508 is typically near load 510, whereas rectifier 504, and DC circuit breaker 506 are remote from load 510 and near generator 502. Positive DC bus 512 and negative DC bus 514 are therefore generally long cable or wire runs. Positive DC bus 512 and negative DC bus 514 are capacitively coupled to ground through capacitors 516 located at the generator side and at the load side. The capacitive coupling, in certain embodiments, is integrated within rectifier 504 and inverter 508.

Generator 502 is coupled to rectifier 504 by a first AC bus 518, which includes one or more phase. Rectifier 504 converts an AC output of generator 502 to a positive DC output 520 and a negative DC output 522 that each couple to DC circuit breaker 506.

Load 510 is coupled to inverter 508 by a second AC bus 524, which includes one or more phase. Inverter receives a positive DC input 526 from positive DC bus 512 and a negative DC input 528 from negative DC bus 514, and generates AC power for load 510.

DC circuit breaker 506 is coupled in-line with positive DC bus 512 and negative DC bus 514, and includes main circuits 530 and transient circuits 532. Main circuits 530 are coupled in parallel with transient circuits 532. DC circuit breaker 506 also includes semiconductor switches 534. Semiconductor switches 534 are coupled between positive DC bus 512 and ground, and between negative DC bus 514 and ground. DC circuit breaker 506 operates as do DC circuit breakers 300 and 400 (shown in FIGS. 3 and 4).

Figure 6:
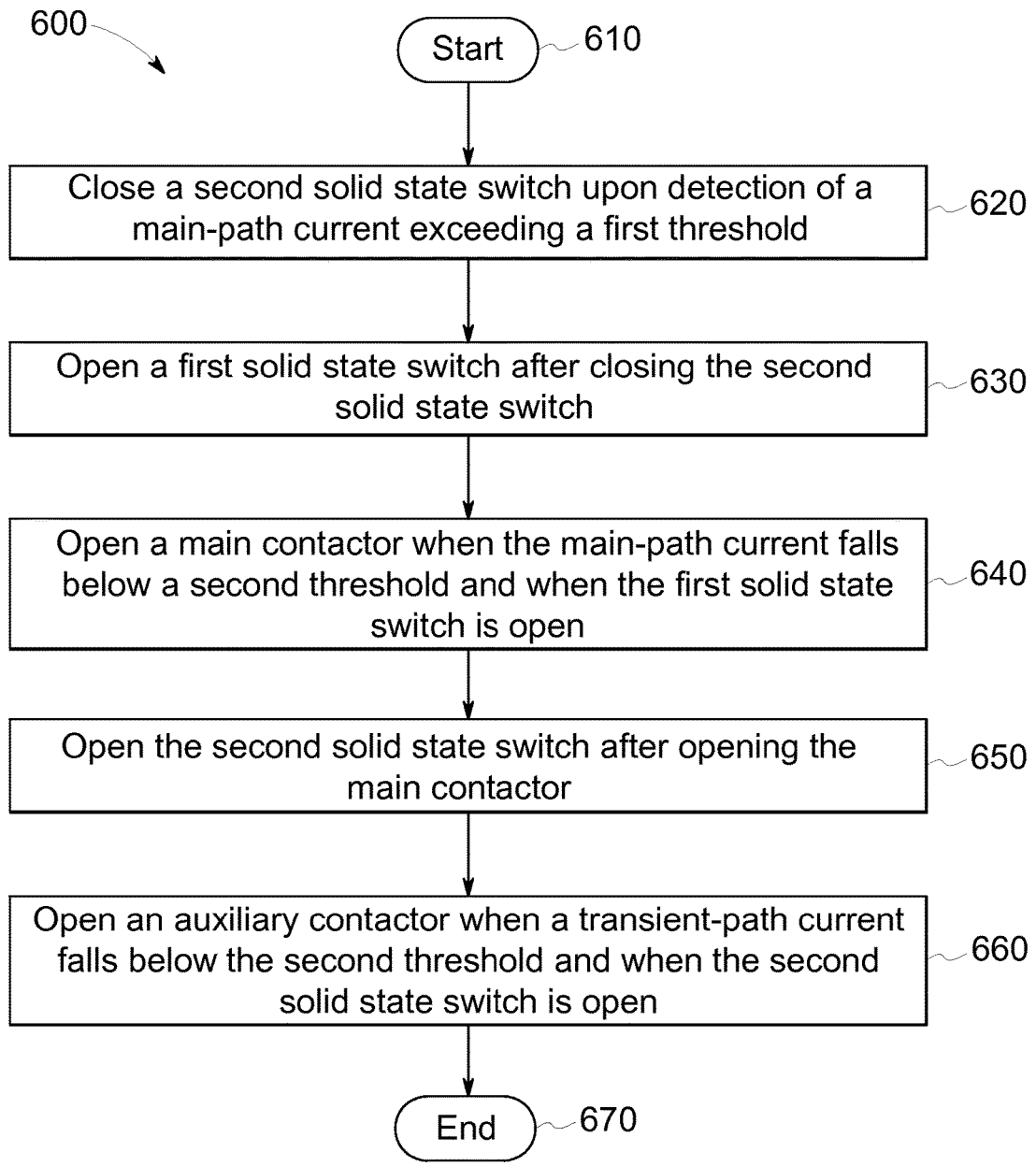
FIG. 6 is a flow diagram of an exemplary method of operating a DC circuit breaker, such as the DC circuit breakers shown in FIGS. 1-5.

FIG. 6 is a flow diagram of an exemplary method 600 of operating DC circuit breaker 300 (shown in FIG. 3). Referring now to FIGS. 3 and 5, the method begins at a start step 610. At an over-current detection step 620, second solid state switch 316 is closed upon detection of main-path current exceeding a first threshold. At a first current diversion step 630, first solid state switch 312 is opened after solid state switch 316 is closed. At a main path interruption step 640, main contactor 310 is opened when the main-path current falls below a second threshold and when first solid state switch 312 is open. At a second current diversion step 650, second solid state switch 316 is opened after main contactor 310 is opened. When the transient-path current falls below the second threshold and second solid state switch 316 is opened, auxiliary contactor 314 is opened at a transient path interruption step 660. The method ends at an end step 670.

In certain embodiments, DC circuit breaker 300 includes high-voltage semiconductor switch 322 coupled between load terminal 306 and ground. During a high impedance fault, method 600 further includes closing high-voltage semiconductor switch 322, which diverts the current from main circuit 302 to ground. High-impedance faults occur, for example, and without limitation, when a human creates a path from line to ground. High-impedance refers to the impedance of a human relative to a low-impedance fault, such as, for example, and without limitation, an equipment fault. The method continues with main path interruption step 640, where main contactor 310 is opened. High-voltage semiconductor switch 322 thus facilitates a quick break sufficient for human fault protection.

The above described DC circuit breakers provide current interruption without arc and galvanic isolation between line and load. More specifically, the DC circuit breakers described herein include a main mechanical contactor in series with a solid state switch and a parallel high-impedance snubbing circuit. Upon detection of an over-current, the parallel high-impedance snubbing circuit diverts current from the main circuit through operation of solid state switches. The main mechanical contactor can then open under substantially lower current conditions and without arc. The DC circuit breakers described herein facilitate DC current interruption without arc, thus improving service life and cost of the DC circuit breakers. Moreover, the DC circuit breakers described herein provide galvanic isolation in compliance with electrical safety standards.

An exemplary technical effect of the methods, systems, and apparatus described herein includes at least one of: (a) improved galvanic isolation in DC circuit breakers while open; (b) arc-free DC interruption due to series combination of mechanical contactor and solid state switches; (c) improved service life of DC circuit breakers due to less frequent occurrence of arcing; (d) improved high-impedance fault protection in the event of a human fault; (e) DC switching times below 10 milliseconds and on the order of 1 millisecond; (f) reduced manufacturing cost due to easing of specifications directed to arc suppression; and (g) reduced capital expenditure as a result of service life and manufacturing cost improvements.

Exemplary embodiments of methods, systems, and apparatus for DC circuit breakers are not limited to the specific embodiments described herein, but rather, components of systems and/or steps of the methods may be utilized independently and separately from other components and/or steps described herein. For example, the methods may also be used in combination with other non-conventional DC circuit protection systems, and are not limited to practice with only the systems and methods as described herein. Rather, the exemplary embodiment can be implemented and utilized in connection with many other applications, equipment, and systems that may benefit from increased efficiency, reduced operational cost, and reduced capital expenditure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A direct current (DC) circuit breaker comprising:
    a main circuit configured to carry a main-path current, said main circuit comprising:
        a first solid state switch configured to open when the main-path current exceeds a first threshold;
        a main contactor serially coupled to said first solid state switch, said main contactor configured to open when said first solid state switch is open and the main-path current falls below a second threshold; and
    a transient circuit coupled in parallel to said main circuit and configured to carry a transient-path current, said transient circuit comprising:
        a second solid state switch configured to:
            close when the main-path current exceeds the first threshold and before said first solid state switch is opened; and
            open after said main contactor opens; and
        an auxiliary contactor serially coupled to said second solid state switch, said auxiliary contactor configured to open when said second solid state switch is open and the transient-path current falls below the second threshold.

2. The DC circuit breaker in accordance with claim 1, wherein said main contactor is a mechanical contactor.

3. The DC circuit breaker in accordance with claim 1, wherein said first solid state switch is a low-voltage metal-oxide semiconductor field-effect transistor (MOSFET) switch.

4. The DC circuit breaker in accordance with claim 1, wherein said second solid state switch comprises a high-voltage insulated-gate bipolar transistor (IGBT).

5. The DC circuit breaker in accordance with claim 1, wherein said transient circuit further comprises a voltage clamping device coupled in parallel to said second solid state switch.

6. The DC circuit breaker in accordance with claim 5, wherein said transient circuit further comprises a capacitor coupled in parallel to said second solid state switch and said voltage clamping device.

7. The DC circuit breaker in accordance with claim 1, wherein said main contactor and said auxiliary contactor are integrated as a single three-pole mechanical contactor, said single three-pole mechanical contactor comprising:
    a main control coil;
    an auxiliary control coil;
    a common contact;
    a main contact configured to be coupled to said common contact upon energizing said main control coil; and
    an auxiliary contact configured to be coupled to said common contact upon energizing said auxiliary control coil.

8. The DC circuit breaker in accordance with claim 1 further comprising a high-voltage semiconductor switch coupled between said main circuit and ground, said semiconductor switch configured to remain open during normal operation and further configured to close upon detection of a high-impedance fault.

9. The DC circuit breaker in accordance with claim 1, wherein, to close said main circuit:
    said auxiliary contactor is further configured to close upon a command;
    said second solid state switch is further configured to close after said auxiliary contactor is closed, thereby closing said transient circuit;
    said main contactor is further configured to close when said first solid state switch is open and after said auxiliary contactor and said second solid state switch are closed;
    said first solid state switch is further configured to close after said main contactor is closed, thereby closing said main circuit; and
    said second solid state switch is further configured to open after said main circuit is closed, thereby opening said transient circuit.

10. A method of operating a direct current (DC) circuit breaker, said method comprising:
    closing, upon detection of a main-path current through a first solid state switch exceeding a first threshold, a second solid state switch in a transient circuit;

opening the first solid state switch after closing the second solid state switch, thereby diverting the main-path current to the transient circuit;

opening a main contactor when the main-path current falls below a second threshold and the first solid state switch is open;

opening the second solid state switch after opening the main contactor; and opening an auxiliary contactor, in the transient circuit, when a transient-path current falls below the second threshold and the second solid state switch is open.

11. The method in accordance with claim 10, wherein opening the first solid state switch comprises diverting the main-path current from a main circuit through the main contactor to a transient circuit through the auxiliary contactor, thereby conducting the transient-path current.

12. The method in accordance with claim 11, wherein opening the second solid state switch comprises diverting the transient-path current from the second solid state switch to a parallel-coupled metal-oxide varistor (MOV).

13. The method in accordance with claim 12, wherein diverting the transient-path current to the parallel-coupled MOV comprises damping the transient-path current to facilitate protecting the first solid state switch from an over-voltage condition.

14. The method in accordance with claim 12, wherein diverting the transient-path current from the second solid state switch further comprises applying a transient-path voltage to a parallel-coupled capacitor to facilitate protecting the first solid state switch from an over-voltage condition.

15. The method in accordance with claim 10, wherein the second threshold is substantially zero amperes.

16. The method in accordance with claim 10 further comprising coupling the first solid state switch to ground upon detecting a high-impedance fault, thereby shorting the main-path current to ground.

17. The method in accordance with claim 10 further comprising:
closing, upon receipt of a command to close the DC circuit breaker, the auxiliary contactor;
closing the second solid state switch after closing the auxiliary contactor, thereby closing the transient circuit;
closing the main contactor after closing the second solid state switch;
closing the first solid state switch after closing the main contactor, thereby closing a main circuit; and
opening the second solid state switch after closing the main circuit, thereby opening the transient circuit.

18. A direct current (DC) circuit breaker comprising:
a line terminal;
a load terminal;
a contactor coupled between said line terminal and said load terminal, said contactor comprising:
a main circuit comprising a main contactor and a metal-oxide semiconductor field-effect transistor (MOSFET) switch; and
a transient circuit coupled in parallel to said main circuit;
a current sensor configured to measure a current through said contactor; and
a driver coupled to said contactor and said current sensor, said driver configured to:
close said transient circuit when the current exceeds a first threshold;
open said MOSFET switch and, subsequently, said main contactor after said transient circuit is closed; and
open said transient circuit after said main contactor opens.

19. The DC circuit breaker in accordance with claim 18, wherein said main circuit further comprises said main contactor serially coupled with said MOSFET switch.

20. The DC circuit breaker in accordance with claim 19, wherein said driver is further configured to open said main contactor when the current falls below a second threshold.

21. The DC circuit breaker in accordance with claim 18, wherein said transient circuit comprises:
an auxiliary contactor; and
a high-voltage insulated-gate bipolar transistor (IGBT) switch serially coupled to said auxiliary contactor.

22. The DC circuit breaker in accordance with claim 21, wherein said transient circuit further comprises a metal-oxide varistor (MOV) coupled in parallel to said high-voltage IGBT switch, said MOV further coupled in series with said auxiliary contactor.

23. The DC circuit breaker in accordance with claim 21, wherein said transient circuit further comprises a capacitor coupled in parallel to said high-voltage IGBT switch, said capacitor further coupled in series with said auxiliary contactor.

24. The DC circuit breaker in accordance with claim 21, wherein said driver is further configured to:
close said high-voltage IGBT switch when the current exceeds the first threshold;
open said high-voltage IGBT switch after said main contactor opens; and
open said auxiliary contactor after said high-voltage IGBT switch opens and when the current falls below the second threshold.

25. The DC circuit breaker in accordance with claim 18 further comprising a semiconductor switch coupled between said load terminal and ground, said semiconductor switch configured to remain open during normal operation and further configured to close upon detection of a high-impedance fault.

26. The DC circuit breaker in accordance with claim 18, wherein said contactor is configured to open said main circuit and said transient circuit within 1 millisecond of a fault detection.

\* \* \* \* \*